United States Patent
Prabhu et al.

(10) Patent No.: US 12,334,136 B2
(45) Date of Patent: Jun. 17, 2025

(54) INDEPENDENT MULTI-PAGE READ OPERATION ENHANCEMENT TECHNOLOGY

(71) Applicant: Intel NDTM US LLC, Santa Clara, CA (US)

(72) Inventors: Naveen Prabhu Vittal Prabhu, Folsom, CA (US); Aliasgar S. Madraswala, Folsom, CA (US); Bharat Pathak, Folsom, CA (US); Binh Ngo, Folsom, CA (US); Netra Mahuli, Folsom, CA (US); Ahsanur Rahman, Santa Clara, CA (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 826 days.

(21) Appl. No.: 17/357,466

(22) Filed: Jun. 24, 2021

(65) Prior Publication Data
US 2022/0415380 A1 Dec. 29, 2022

(51) Int. Cl.
*G11C 16/04* (2006.01)
*G06F 3/06* (2006.01)
*G11C 11/4076* (2006.01)
*G11C 11/4096* (2006.01)

(52) U.S. Cl.
CPC ........ *G11C 11/4076* (2013.01); *G06F 3/0659* (2013.01); *G11C 11/4096* (2013.01)

(58) Field of Classification Search
CPC ............ G11C 11/4076; G11C 11/4096; G11C 2207/2209; G11C 7/1042; G11C 7/22; G11C 8/12; G11C 16/32; G11C 16/08; G11C 16/26; G11C 16/34; G06F 3/0659
See application file for complete search history.

(56) References Cited

U.S. PATENT DOCUMENTS

| | | |
|---|---|---|
| 10,002,671 B2 | 6/2018 | Shimizu et al. |
| 10,877,696 B2 | 12/2020 | Wakchaure et al. |
| 2016/0216887 A1* | 7/2016 | Fukuda ............... G06F 12/0246 |
| 2018/0024779 A1* | 1/2018 | Kojima ............... G06F 12/0246 |
| | | 711/103 |
| 2019/0227749 A1 | 7/2019 | Wakchaure et al. |
| 2021/0117335 A1 | 4/2021 | Kondo |
| 2021/0382656 A1* | 12/2021 | Rho ...................... G06F 3/0679 |
| 2023/0062668 A1* | 3/2023 | Vittal Prabhu ........ G11C 16/26 |
| 2023/0065231 A1* | 3/2023 | Wu ..................... G06F 12/0246 |
| 2024/0086317 A1* | 3/2024 | Fu ....................... G06F 12/0882 |

OTHER PUBLICATIONS

European Search Report for EP Patent Application 22164589.8 dated Oct. 14, 2022, 8 pages.

* cited by examiner

*Primary Examiner* — Jay W. Radke
(74) *Attorney, Agent, or Firm* — Morgan, Lewis & Bockius LLP (57) ABSTRACT

Systems, apparatuses and methods may provide for technology that sends a first command to a NAND die, sends first address information to the NAND die, and sends a second command to the NAND die, wherein the first command and the second command define a first command sequence and wherein the first address information signal a beginning of a first asynchronous read request from a first plurality of planes. In one example, the technology also sends a second command sequence and second address information to the NAND die wherein the second command sequence signals an end of the first asynchronous read request.

20 Claims, 9 Drawing Sheets

INDEPENDENT MULTI-PAGE READ OPERATION ENHANCEMENT TECHNOLOGY

TECHNICAL FIELD

Embodiments generally relate to memory structures. More particularly, embodiments relate to independent multi-page read operation enhancement technology in memory structures.

BACKGROUND

NAND-type flash memory ("NAND memory") may be organized into multiple cells, with each cell containing one or more bits of data and being accessible through an array of bit lines (columns) and word lines (rows). In such a case, the number of bits per cell may depend on how many distinct voltage levels can be achieved during program operation(s). As NAND density increases from one generation to the next, the total number of NAND dies for the same amount of storage reduces. The reduced number of NAND dies may degrade read performance because there are fewer opportunities to perform read operations in parallel.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
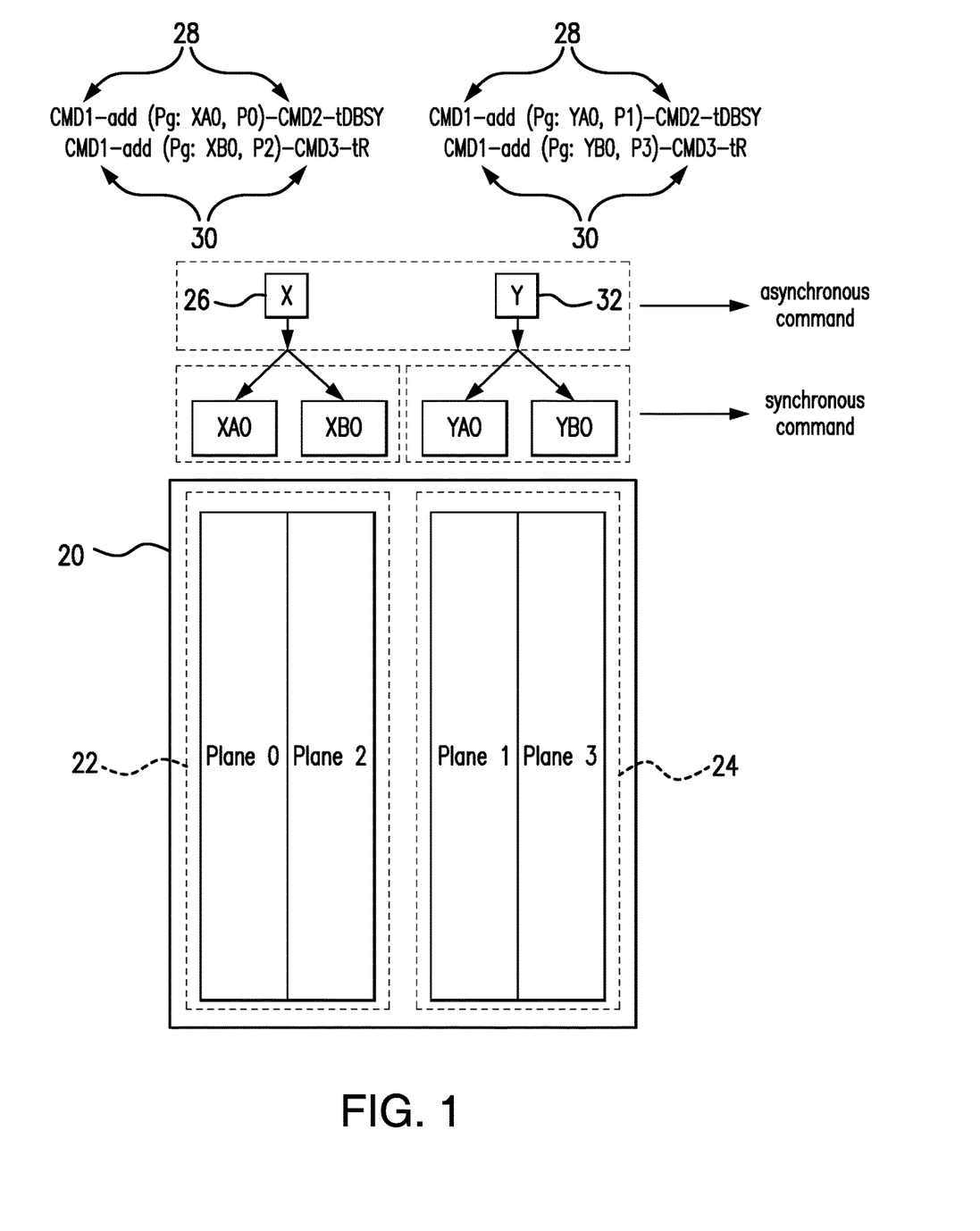
FIG. 1 is an illustration of an example of an enhanced independent multi-plane read operation (eIMPRO) "lite" solution according to an embodiment.

Turning now to FIG. 1, an enhanced independent multi-plane read operation (eIMPRO) lite solution is shown in which a NAND die 20 includes a first plurality (e.g., group) of planes 22 (e.g., "Plane 0", "Plane 2") and a second plurality of planes 24 (e.g., "Plane 1", "Plane 3"). In the illustrated example, a first command ("CMD1") and a second command ("CMD2") define a first command sequence 28, wherein sending (e.g., via a command register) the first command sequence 28 and first address information ("Pg: XA0, P0") to the NAND die 20 signals the beginning of a first asynchronous read request 26 (request "X") from the first plurality of planes 22. In an embodiment, the first command and a third command ("CMD3") define a second command sequence 30. In such a case, sending the second command sequence 30 and second address information ("Pg: XB0, P2") may signal the end of the first asynchronous read request 26.

Thus, the first address information may generally identify a first plane (Plane 0) in the first plurality of planes 22. In one example, the first address information specifies a page (e.g., lower page) in memory cells of the first plane. Similarly, the second address information may identify a second plane (Plane 2) in the first plurality of planes 22. Accordingly, the second address information may specify a page (e.g., upper page) in memory cells of the second plane. The first command sequence 28 may access a different type of page than the second command sequence 30.

Similarly, sending the first command sequence 28 and third address information ("Pg: YA0, P1") to the NAND die 20 may signal the beginning of a second asynchronous read request 32 (request "Y") from the second plurality of planes 24. Additionally, sending the second command sequence 30 and fourth address information ("Pg: YB0, P3") may signal the end of the second asynchronous read request 32. In an embodiment, memory cells in the first plurality of planes 22 are coded with a different number of bits than memory cells in the second plurality of planes 24. For example, the memory cells in the first plurality of planes 22 might be coded with one bit per cell (e.g., single level cell/SLC), whereas the memory cells in the second plurality of planes 24 may be coded with four bits per cell (e.g., quad level cell/QLC). While the number of planes shown is four to facilitate discussion, the number of planes may be greater than four (e.g., six, eight), depending on the circumstances.

The illustrated solution enhances performance at least to the extent that signaling the asynchronous read requests 26, 32 via the command sequences 28, 30 provides the ability to conduct more read operations in parallel. Additionally, there are no restrictions on page addresses and block addresses across all of the planes. For example, the first, second, third and fourth address information may all target different pages and/or blocks of data. Moreover, during the time period "tDBSY", the host/controller may wait for a relatively short hard coded time of, for example, 1 microseconds (μs) before issuing the next command.

Figure 2:
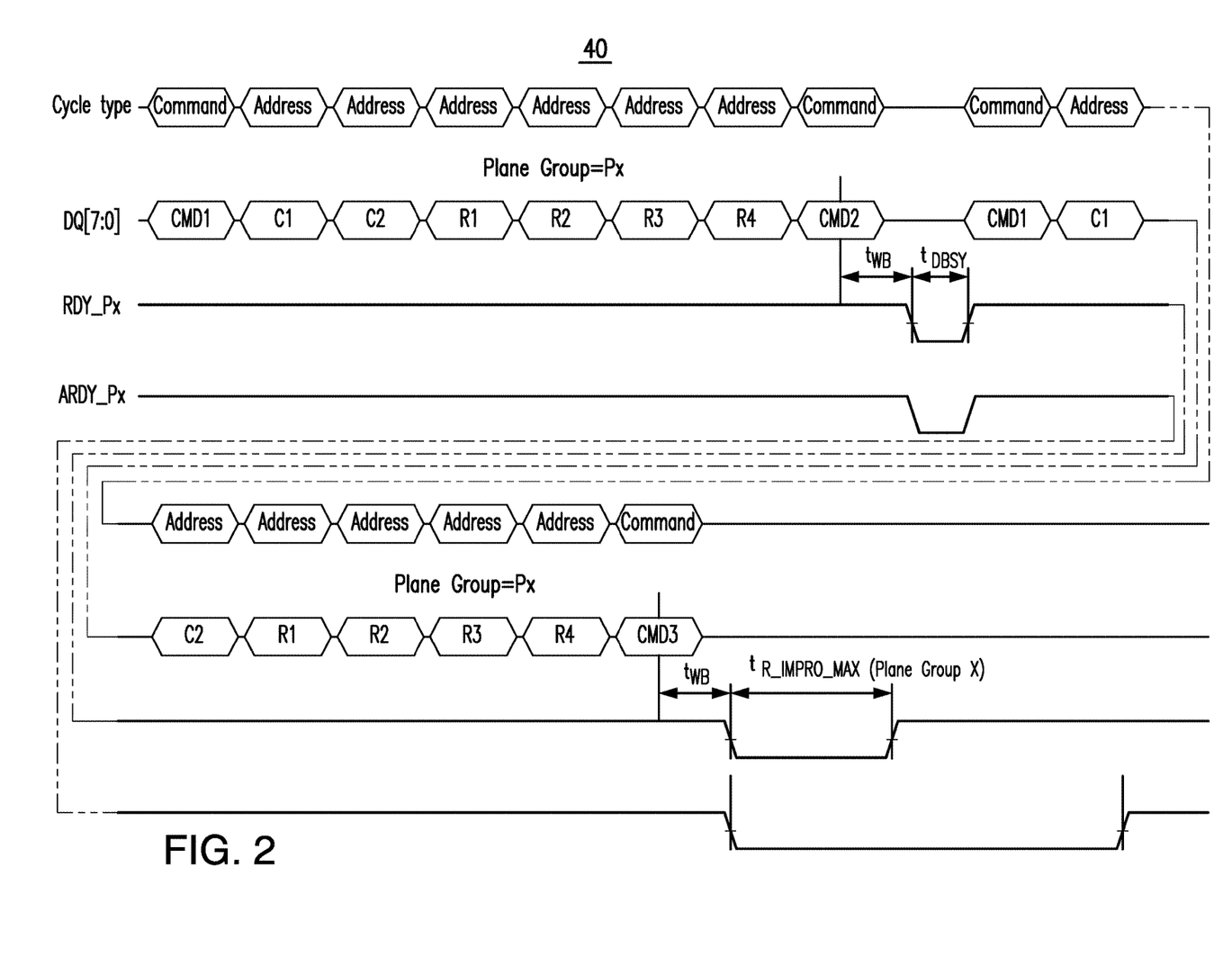
FIG. 2 is a set of signaling diagrams of an example of command sequences according to an embodiment.

FIG. 2 shows a set of signaling diagrams 40 including a first ready ("RDY") voltage 44 for a first plane group and a second ready voltage 46 for a second plane group. In the illustrated example, three multi-plane read operations are conducted from the first plane group and two multi-plane read operations are conducted from the second plane group. The controller monitors the status of the plane group through a Read Status IMPRO command 42 ("72h"). The RDY for the plane group is gated by the max read time ("tR") of the two planes within the plane group. Once the plane group RDY_Px=1, the controller reads out data per plane using eIMPRO the read out sequence (72h+1addr+03h+2addr+E0h).

The first command sequence 48 (CMD1-CMD2) queues a plane to transfer data from the NAND flash array to a cache register of the NAND flash array. The second command sequence 50 (CMD1-CMD3) is issued to trigger an eIMPRO operation on all of the selected planes. All queued planes will transfer data from the NAND Flash array to their respective cache registers. To issue the first command sequence 48, the command (e.g., opcode) CMD1 is written to the command register, then 6-address cycles are written to the address register, followed by writing the CMD2 to the command register. After this command is issued, RDY (e.g., status register/SR6) goes LOW for the selected plane group for tDBSY. During tDBSY, the controller waits for a hard-coded time of, for example, 1 us before issuing the next command. Following tDBSY, to continue the operation, the only valid commands are status operations (72h) and the second command sequence 50 (CMD1-CMD3). After writing the CMD3 command, the controller waits for a write-back time period ("tWB") before issuing any valid commands. Once the IMPRO operation is complete for a particular plane group (RDY_Px=ARDY_Px=1), the controller may queue the next multi-plane IMPRO operation within the same plane group. Enhanced IMPRO may not be supported on partially programmed wordlines.

The following combinations of the eIMPRO operation are permitted. In an embodiment, all other cases are invalid:
1. CMD1-Addr(P0)-CMD2+CMD1-Addr(P2)-CMD3+CMD1-Addr(P1)-CMD2+CMD1-Addr(P3)-CMD3
2. CMD1-Addr(Plane grp X)-CMD3+CMD1-Addr(Plane grp Y)-CMD3. (Plane grp X=0, 2, Plane grp Y=1, 3)
3. CMD1-Addr(P0)-CMD2+CMD1-Addr(P2)-CMD3
4. CMD1-Addr(P1)-CMD2+CMD1-Addr(P3)-CMD3
5. CMD1-Addr(Plane X)-CMD3 (Plane X=P0/1/2/3)
6. CMD1-Addr(Plane grp X)-CMD3+[CMD1-Addr(Plane grp Y)-CMD2+CMD1–Addr(Plane grp Y)–CMD3]. Plane group X and Y belong to different plane groups.

For 16 KB eIMPRO operations, the NAND will perform a "snap" read (e.g., combination 5 above) of 16 KB on the selected plane. In this case, the column address from the controller is ignored and all four inhibit tile groups (ITGs, e.g., 4 KB tiles that slow down read operations) are enabled internally to select the 16 KB.

eIMPRO Status Read

Figure 3:
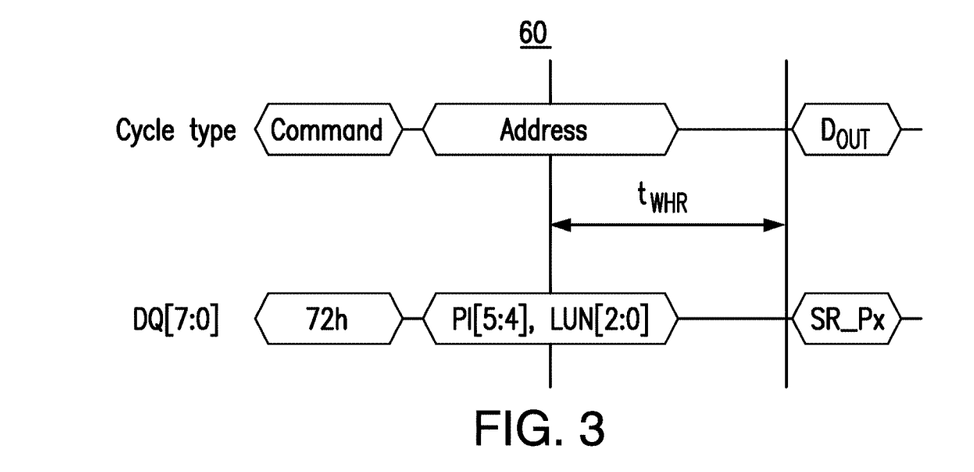
FIG. 3 is a signaling diagram of an example of a status read operation according to an embodiment.

Turning now to FIG. 3, a signaling diagram 60 is shown in which to monitor the status on each plane group, the controller issues an eIMPRO status command (72h-1×Addr). In an embodiment, the controller issues a target logical unit number (LUN) address in bits [2:0] and a target plane address in [5:4] as part of the address cycle. Table I shows the eIMPRO status register descriptions for the eIMPRO status command.

TABLE I

| Status bit | Description | Comments |
| --- | --- | --- |
| SR7_Px | Reserved | Reserved |
| SR6_Px | RDY_Px | Per plane group |
| SR5_Px | ARDY_Px | Per plane group |
| SR4_Px | PERRESET/WP# | Per LUN (1) |
| SR3_Px | Thermal alert | Per plane group |
| SR2_Px | Reserved | Reserved |
| SR1_Px | Reserved | Reserved |
| SR0_Px | Reserved | Reserved | eIMPRO Read Column Enhanced

Figure 4:
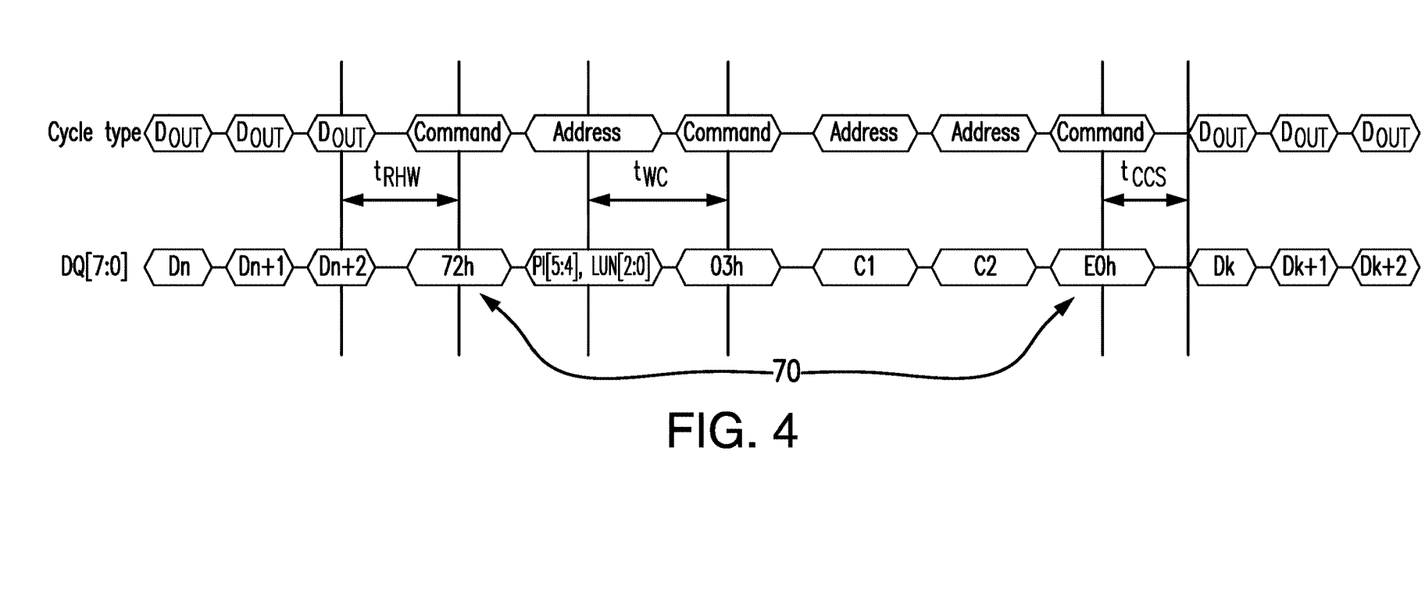
FIG. 4 is a signaling diagram of an example of a read column enhanced operation according to an embodiment.

FIG. 4 demonstrates that once the RDY_Px=1, to read out data from each plane, the controller may issue an IMPRO Read Column enhanced command sequence 70 ("72h-1×Addr (LUN/Plane)+03-2×Addr(Column)-E0h"). The command sequence 70 enables the data output (SDC) for the targeted column/plane/LUN address specified in the sequence. For every readout operation, the controller follows the sequence: 72h-1Addr-03-2Addr-E0h. After the data readout, the controller may queue up more IMPRO operations on the same plane group, as long as the RDY_Px=ARDY_Px=1, where Px is the desired plane. Before issuing any non-IMPRO operations on the LUN, the controller completes IMPRO operations across all planes (e.g., RDY_LUN=ARDY_LUN=1). The controller can then issue any non-IMPRO operations.

Set/Get Feature by Plane for eIMPRO Operations

Figure 5:
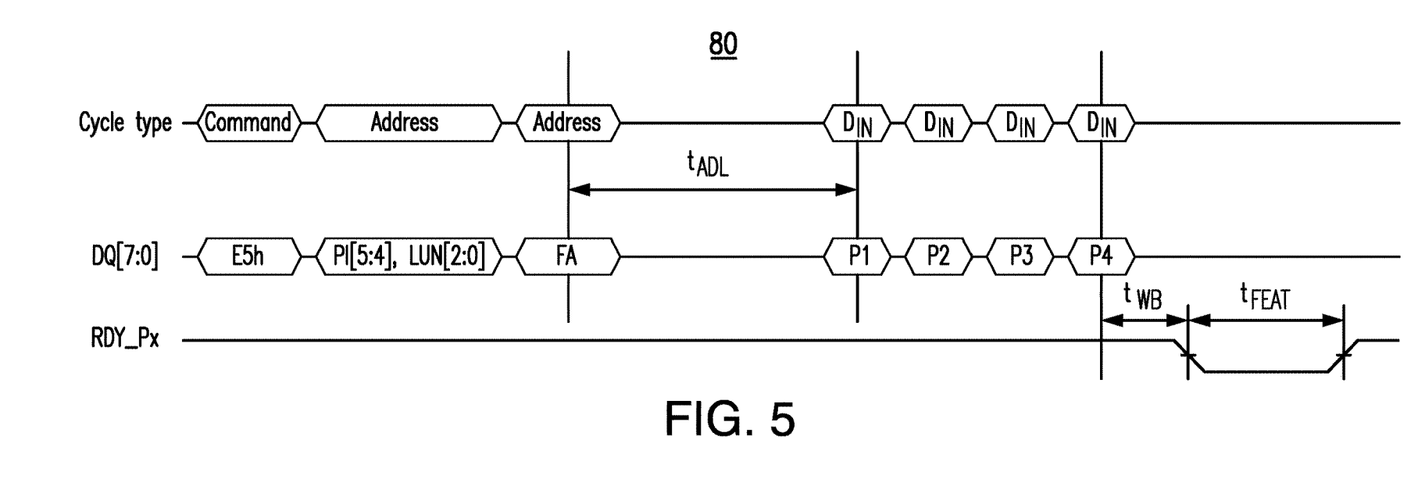
FIG. 5 is a signaling diagram of an example of a set feature on a per-plane basis according to an embodiment.
Figure 6:
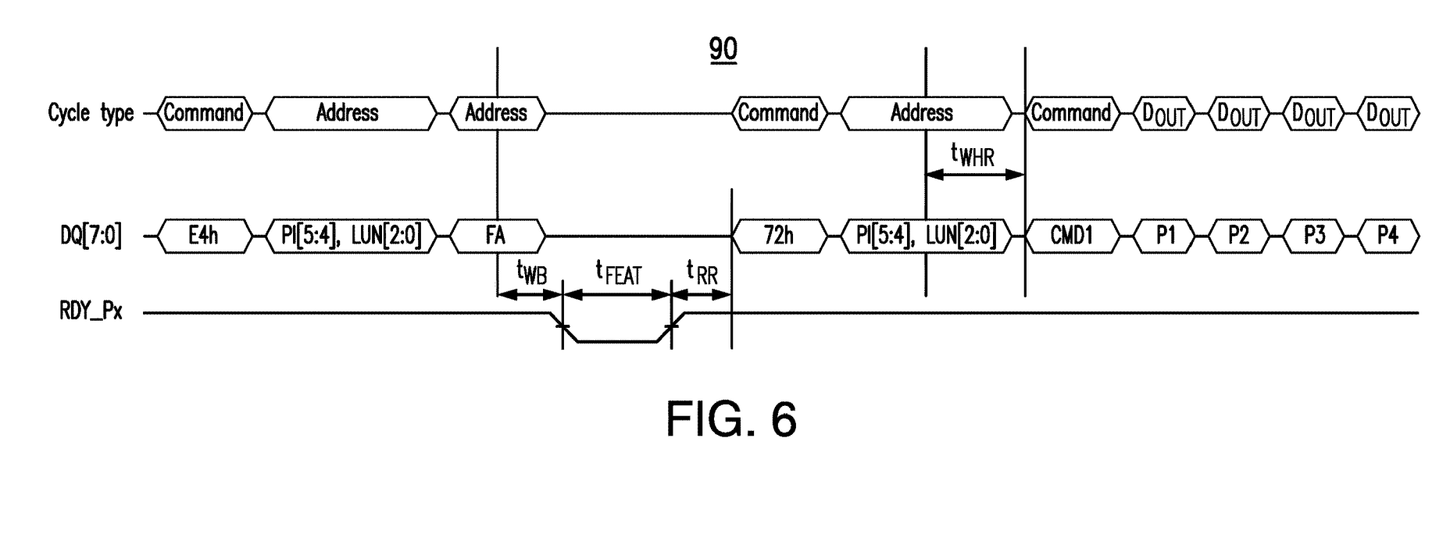
FIG. 6 is a signaling diagram of an example of a get feature on a per-plane basis according to an embodiment.

Turning now to FIGS. 5 and 6, the controller may independently configure the planes to be coded with a different number of bits. A signaling diagram 80 demonstrates that to write the plane level latches, the controller uses a "Set" feature by a plane command sequence: E5h-1 ADDR(P1=5:4, LUN=2:0)-P1-P2-P3-P4. In an embodiment, the controller places a target plane address [5:4] and LUN address [2:0] in the address cycle of the Set feature by the plane command sequence. The NAND will trigger tFEAT only for the selected plane on the selected LUN.

A signaling diagram 90 demonstrates that to read from the plane level latches, the controller uses a "Get" feature by plane command sequence: E4h-1 ADDR(P1=5:4, LUN=2:0). In an embodiment, the controller places a target plane address [5:4] and LUN addr [2:0], in the address cycle of the Get feature by the plane command sequence. Again, the NAND will trigger tFEAT only for the selected plane. Once RDY_Px=ARDY_Px=1, the controller can readout the get feature data per plane using the sequence: 72h+1Addr+CMD1.

Set/Get Trim Data by Plane for IMPRO Operations

Figure 7:
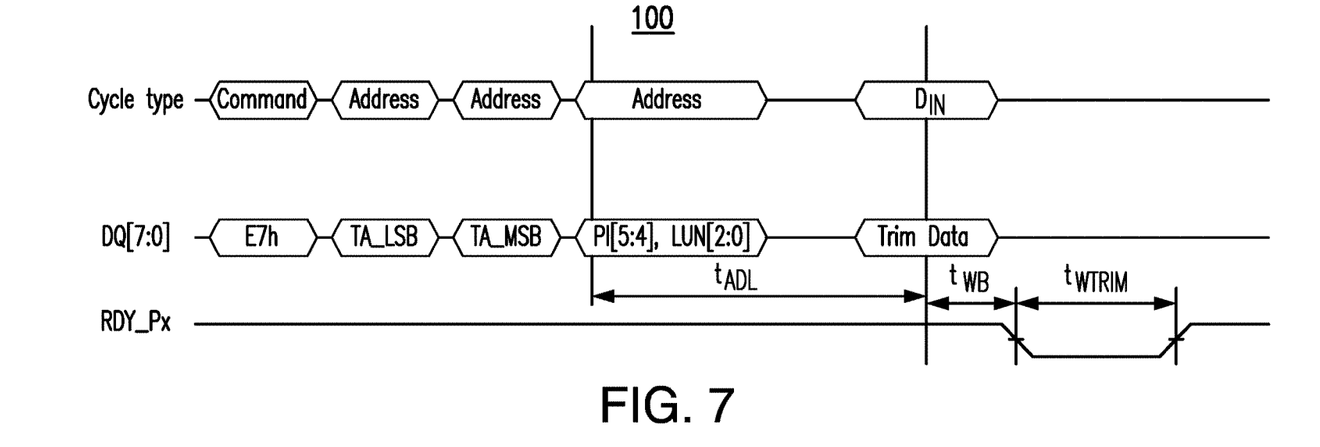
FIG. 7 is a signaling diagram of an example of a set trim data feature on a per-plane basis according to an embodiment.
Figure 8:
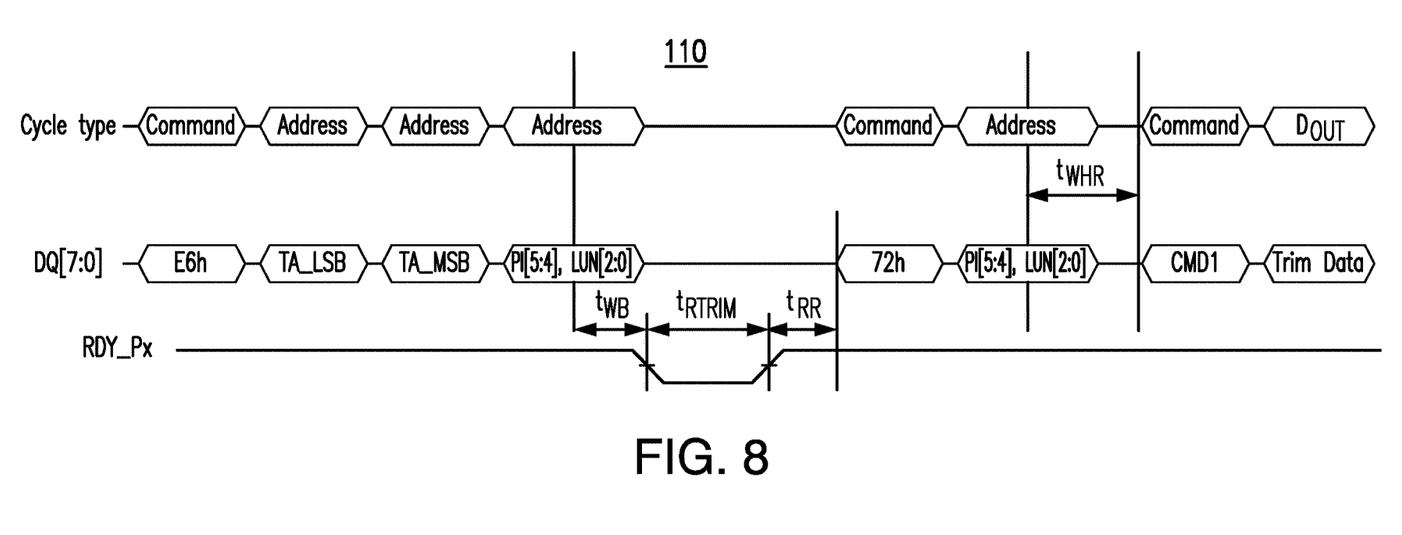
FIG. 8 is a signaling diagram of an example of a get trim data feature on a per-plane basis according to an embodiment.

Turning now to FIGS. 7 and 8, a signaling diagram 100 demonstrates that for an eIMPRO operation, the NAND will maintain dedicated SRAM per plane that can be accessed (read/write) via a Set (or Get) trim data per plane command sequence. In an embodiment, the IMPRO SRAM for Plane0/Plane2 is shared with legacy main SRAM.

To write the plane level trim data, the controller uses a Set trim data by plane command sequence: E7h-TA_L-SBTA_MSB-1ADDR(P1=5:4,LUN=2:0)-TRIM_DATA. Additionally, the controller places a target plane address [5:4] and LUN addr [2:0] in the address cycle of the Set trim data by plane command sequence. The NAND will trigger tWTRIM_plane only for the selected plane.

A signaling diagram 110 demonstrates that to read the plane level trim data, the controller uses a Get trim data by a plane command sequence: E6h-TA_LSBTA_MSB-1ADDR(P1=5:4,LUN=2:0). In an embodiment, the controller places a plane address [5:4] and LUN addr [2:0], in the address cycle of the Get trim data by plane command sequence. The NAND will trigger tRTRIM_plane only for the selected plane. Once RDY_Px=ARDY_Px=1, the controller can readout the Get trim data for the selected plane using the sequence: 72h+1Addr(P1=5:4,LUN=2:0)+CMD1.

OTF (on the Fly) SLC for eIMPRO

Figure 9:
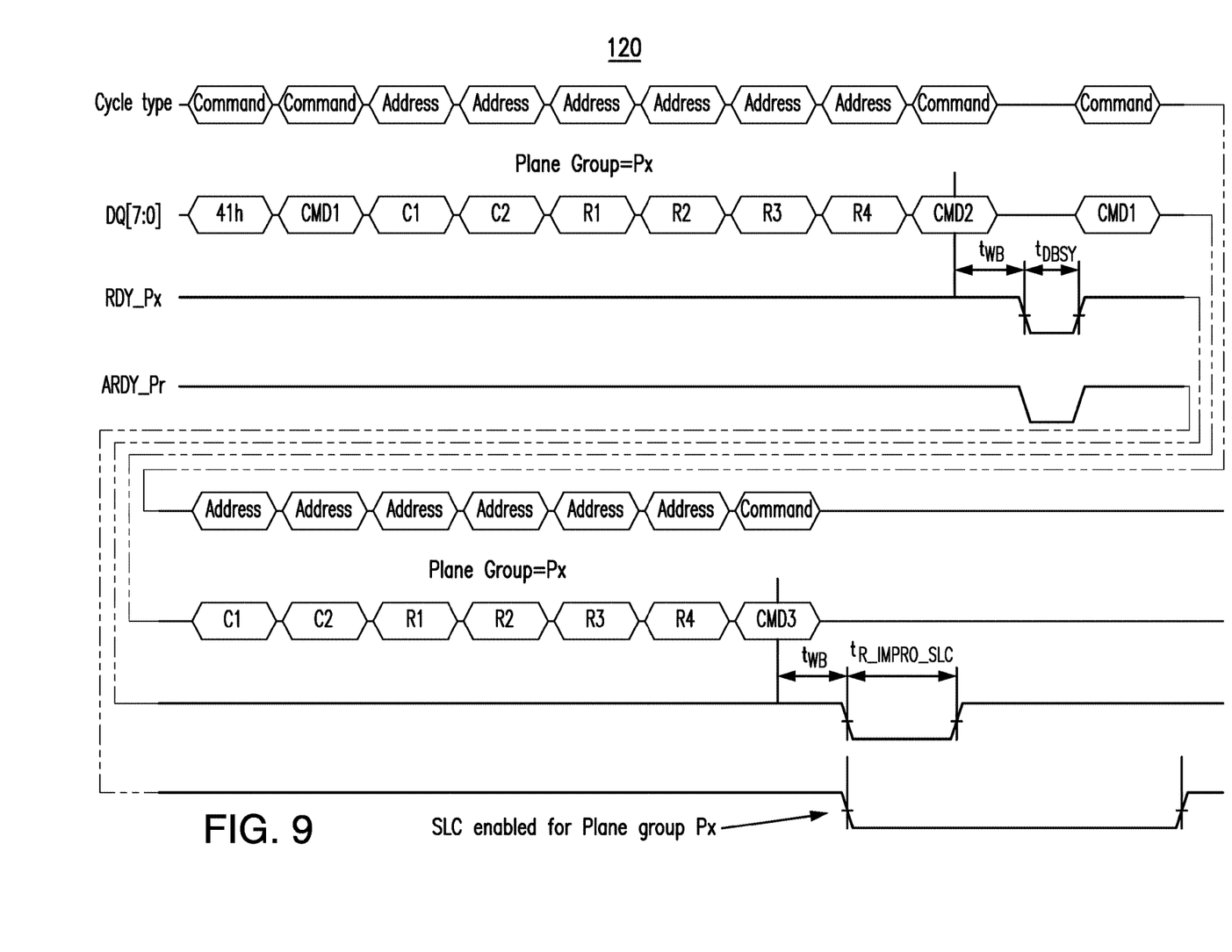
FIG. 9 is a signaling diagram of an example of a command sequence to switch to single level cell (SLC) mode on the fly (OTF) according to an embodiment.

Turning now to FIG. 9, a signaling diagram 120 demonstrates that the controller may switch the bits per cell mode OTF to SLC operation for each plane group. To enable eIMPRO in SLC mode, the controller uses a "Prefix" opcode (41h). In an embodiment, the controller issues the Prefix opcode 41h followed by the eIMPRO operation: 41h+CMD1+Addr(Pln grp X)+CMD2+CMD1+Addr(Pln grp X)+CMD3. The NAND will perform IMPRO in SLC mode only for the selected plane group specified in the array address. With the Prefix opcode for SLC entry with IMPRO, automatic exit from SLC mode is enabled by default. At the end of SLC IMPRO operation, the NAND switches the plane group back to native mode. In one example, the NAND will not support the option to disable automatic exit during OTF SLC IMPRO operations.

Figure 10A:
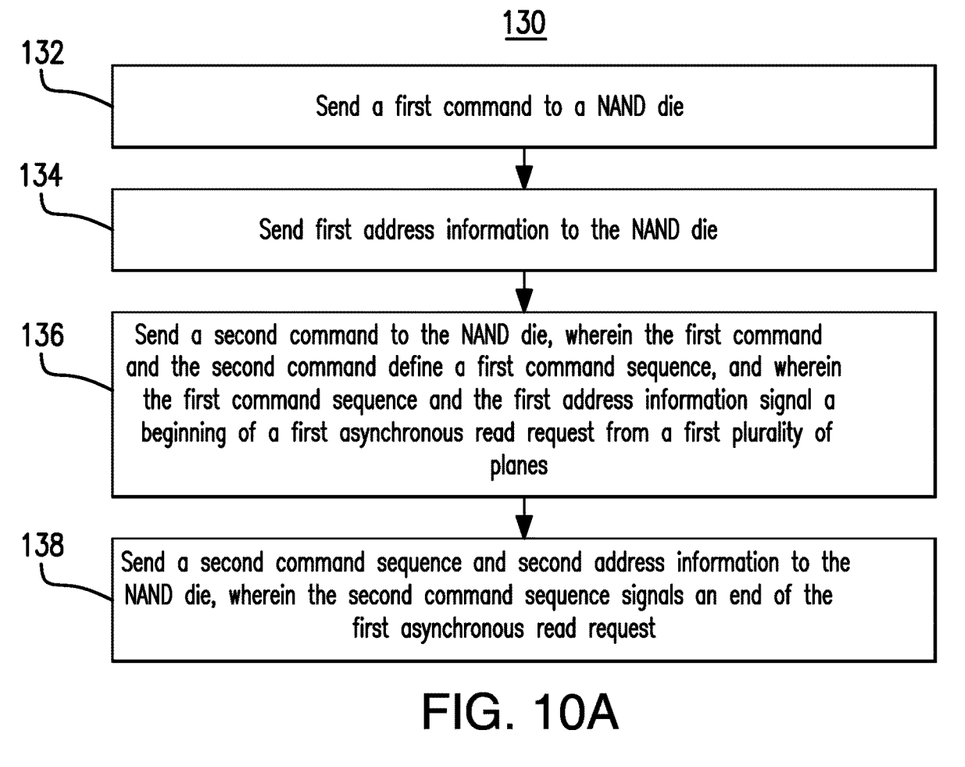
FIGS. 10A-10B are flowcharts of examples of methods of operating a performance-enhanced controller according to an embodiment.

FIG. 10A shows a method 130 of operating a performance-enhanced controller. The method 130 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

Illustrated processing block 132 sends (e.g., via a command register) a first command to a NAND die, wherein block 134 sends first address information to the NAND die. Additionally, block 136 sends a second command to the NAND die, wherein the first command and the second command define a first command sequence. In the illustrated example, the first command sequence and the first address information signal a beginning of a first asynchronous read request from a first plurality of planes (e.g., plane group). Block 138 may send a second command sequence and second address information to the NAND die, wherein the second command sequence signals an end of the first asynchronous request.

In an embodiment, the first address information identifies a first plane in the first plurality of planes and the second address information identifies a second plane in the first plurality of planes. Additionally, the second command sequence may include the first command and a third command. The method 130 enhances performance at least to the extent that signaling the first asynchronous read request via the command sequence provides the ability to conduct more read operations in parallel. Additionally, there are no restrictions on page addresses and block addresses across all planes. For example, the first and second address information may target different pages and/or blocks of data.

Figure 10B:
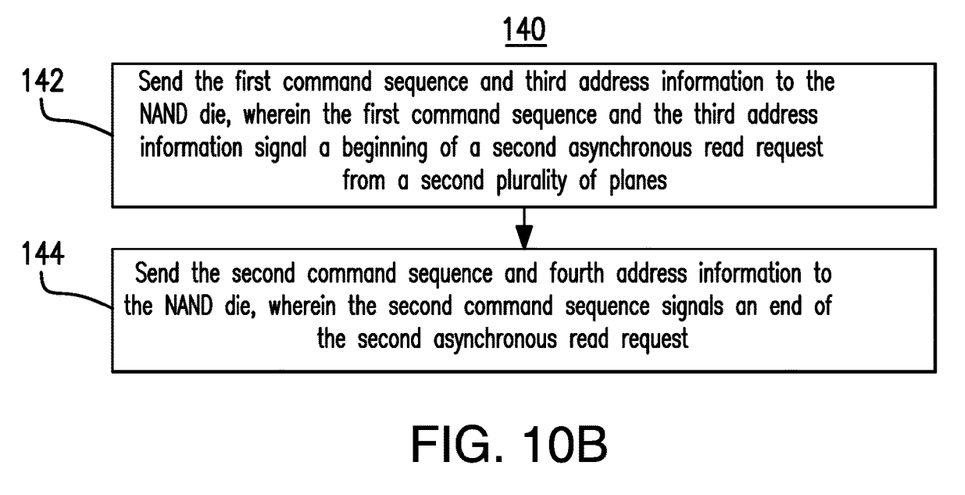

FIG. 10B shows another method 140 of operating a performance-enhanced controller. The method 140 may generally be conducted after the method 130 (FIG. 10A), already discussed. More particularly, the method 140 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

Illustrated processing block 142 sends the first command sequence and third address information to the NAND die, wherein the first command sequence and the third address information signal a beginning of a second asynchronous read request from a second plurality of planes. In an embodiment, memory cells in the first plurality of planes are coded with a different number of bits than memory cells in the second plurality of planes. For example, memory cells in the first plurality of planes might be coded with one bit per cell (e.g., SLC), whereas memory cells in the second plurality of planes may be coded with three bits per cell (e.g., triple level cell/TLC). Block 144 sends the second command sequence and fourth address information to the NAND die, wherein the second command sequence signals an end of the second asynchronous read request. The illustrated method 140 therefore further enhances performance by enabling reads to be concurrently conducted on multiple plane groups in a NAND die.

Figure 11:
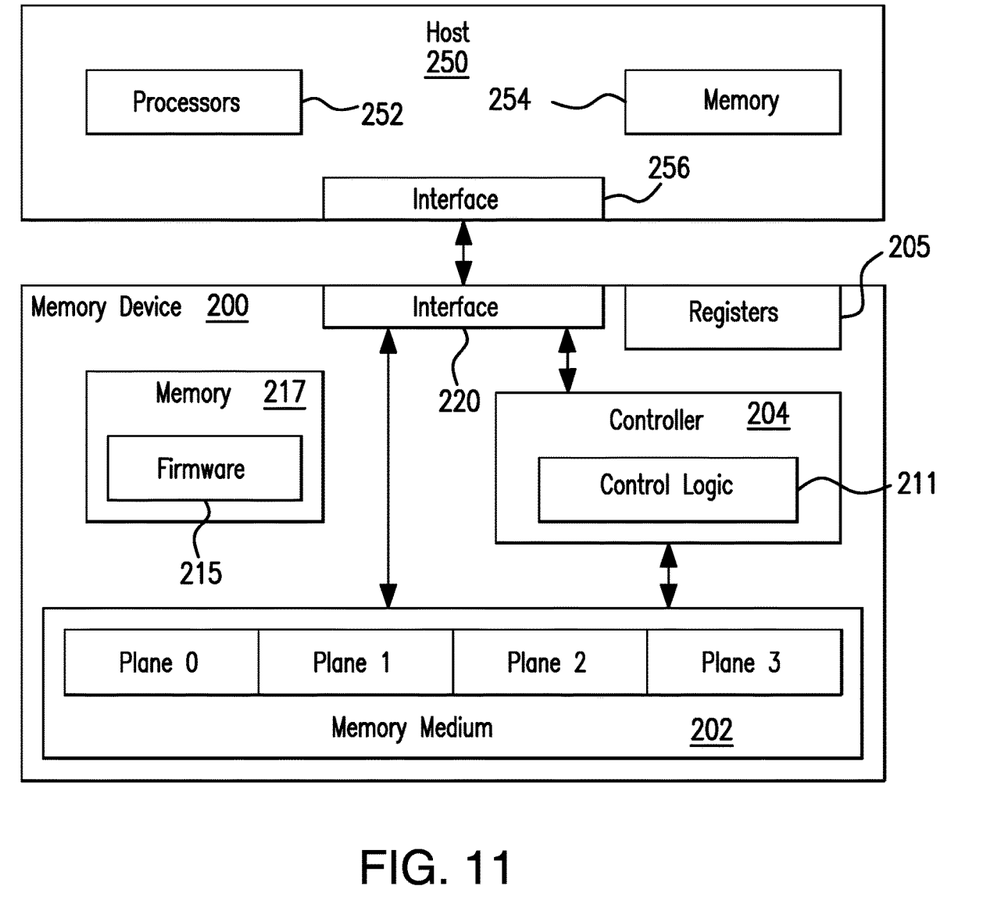
FIG. 11 is a block diagram of an example of a performance-enhanced computing system according to an embodiment.

FIG. 11 shows a computing system that includes a host 250 and a memory device 200. The host 250 and the memory device 200 can be an example of a system that exists within the confines of a computer package (e.g., within a laptop/notebook, server, or other computer). In other examples, the memory device 200 may also be accessed via a larger network such as a local area network (e.g., an Ethernet network), or a wide area network (such as a wireless cellular network, the Internet, etc.). Such examples may be in compliance with a standard such as NVMe-oF (non-volatile memory express over fabrics). The host 250 includes one or more processors 252, memory 254, and other components that are omitted from the drawing for clarity.

The memory device 200 includes a memory medium 202 (e.g., NAND die) that stores data. The memory medium 202 can be a memory or storage medium that can store one or more bits in memory cells. For example, the memory medium 202 can include non-volatile and/or volatile types of memory. In one example, the memory medium 202 includes one or more non-volatile memory dies, each divided into multiple planes or groups. In some examples, the memory medium 202 can include block addressable memory devices, such as NAND technologies.

The memory device 200 can communicate with the host 250 using respective interfaces 220 and 256. In one example, the interface 256 is a part of a peripheral control hub (PCH). In the illustrated example, a controller 204 is coupled with the host 250 using the interface 220. In one example, the controller 204 is an ASIC (application specific integrated circuit). In one example, the interfaces 220, 256 are compliant with a standard such as PCI Express (PCIe), serial advanced technology attachment (ATA), a parallel ATA, universal serial bus (USB), and/or other interface protocol. The controller 204 can communicate with elements of the computing platform to read data from the memory medium 202 or write data to the memory medium 202. Although in this disclosure, the term "host" is referring to a system with a processor (or other device sending requests to access data stored in a non-volatile memory) and an interface that communicates with the NAND (e.g., the host 250), some implementations may refer to the controller 204 as a "host" relative to the non-volatile memory medium 202.

The controller 204 can be configured to receive requests from the host 250 and generate and perform commands concerning the use of the memory medium 202 (e.g., to read data, write, or erase data). Other commands may include, for example, commands to read status, commands to change configuration settings, a reset command, etc. The controller 204 can be implemented with hardware (e.g., logic circuitry), software, firmware, or a combination of hardware, software and firmware. Examples of logic circuitry include dedicated hardwired logic circuitry (including, e.g., one or more state machine logic circuits), programmable logic circuitry (e.g., FPGA), and a programmable logic array (PLA). In one example, logic circuitry is designed to execute some form of program code such as SSD (solid state drive) firmware (e.g., an embedded processor, embedded controller, etc.). The memory device typically also includes memory 217 coupled to control logic 211, which can be used to cache NVM data and store firmware 215 executed by the controller 204. The term "control logic" can be used to refer to both logic circuitry, firmware, software, or a combination. For example, control logic can refer to the control logic 211, firmware 215, or both. Although the firmware 215 is illustrated as being stored in memory 217, the firmware 215 may also or alternatively be stored in the controller 204 and/or the memory die.

The controller 204 is coupled with the memory medium 202 to control or command the memory to cause operations to occur (e.g., read, program, erase, suspend, resume, and other operations). Communication between the memory medium 202 and the controller 204 may include the writing to and/or reading from specific registers such as, for example, registers 208. Such registers may reside in the controller 204, in the memory medium 202, or externally to the controller 204 and the memory medium 202. Registers or memory within the memory medium 202 may be reachable by the controller 204 by, for example, an internal interface of the memory device 200 that exists between the controller 204 and memory medium 202 (e.g., an Open NAND Flash Interface (ONFI) interface, a proprietary interface, or other interface) to communicatively couple the controller 204 and the memory medium 202. Input/output (I/O) pins and signal lines communicatively couple the controller 204 with the memory medium 202 to enable the transmission of read and write data between the controller 204 and the memory medium 202. The I/O pins may also be used to transmit other data, such as status information of the dies or planes of memory medium 202.

The controller 204 can be coupled to word lines of the memory medium 202 to select one of the word lines, apply read voltages, apply program voltages combined with bit line potential levels, or apply erase voltages. The controller 204 can be coupled to bit lines of memory medium 202 to read data stored in the memory cells, determine a state of the memory cells during a program operation, and control potential levels of the bit lines to promote or inhibit programming and erasing. Other circuitry can be used for applying selected read voltages and other signals to memory medium 202.

As mentioned above, the memory medium 202 can include a NAND memory. Typical NAND dies have multiple planes per die. A plane includes multiple memory cells, which may be grouped into blocks. A block is typically the smallest erasable entity in a NAND flash die. In one example, a block includes a number of cells that are coupled to the same bitline. A block includes one or multiple pages of cells. The size of the page can vary depending on implementation. In one example, a page has a size of 16 kB. Page sizes of less or more than 16 kB are also possible (e.g., 512 B, 2 kB, 4 kB, etc.).

In an embodiment, the control logic 211 and/or the firmware 215 enable the controller 204 to conduct one or more aspects of the method 130 (FIG. 10A) and/or the method 140 (FIG. 10B), already discussed. Thus, the controller 204 may send a first command to the memory medium 202, send first address information to the memory medium 202, and send a second command to the memory medium 202, wherein the first command and the second command define a first command sequence. In an embodiment, the first command sequence and the first address information signal a beginning of a first asynchronous read request from a first plurality of planes. Additionally, the controller 204 may send a second command sequence and second address information to the memory medium 202, wherein the second command sequence signals an end of the first asynchronous read request.

In one example, the controller 204 also sends the first command sequence and third address information to the memory medium 202, wherein the first command sequence and the third address information signal a beginning of a second asynchronous read request from a second plurality of planes. In such a case, the controller 204 may send the second command sequence and fourth address information to the memory medium 202, wherein the second command sequence signals an end of the second asynchronous read request.

The memory device 200 and/or the controller 204 are therefore considered performance-enhanced at least to the extent that signaling the first and second asynchronous read requests via the first and second command sequences provides the ability to conduct more read operations in parallel. Additionally, there are no restrictions on page addresses and block addresses across all planes.

Figure 12:
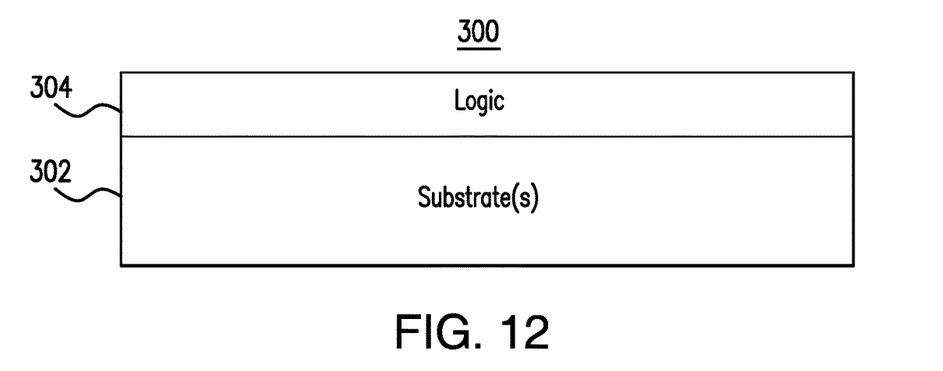
FIG. 12 is an illustration of a semiconductor apparatus according to an embodiment.

Turning now to FIG. 12, a semiconductor apparatus 300 (e.g., chip, package) is shown. In the illustrated example, the semiconductor apparatus 300 includes a substrate 302 (e.g., silicon, sapphire, gallium arsenide) and logic 304 (e.g., transistor array and other integrated circuit/IC components) coupled to the substrate 302. The logic 304, which may include one or more of configurable or fixed-functionality hardware, may be configured to perform one or more aspects of the method 130 (FIG. 10A) and/or the method 140 (FIG. 10B), already discussed.

Thus, the logic 304 may send a first command to a NAND die, send first address information to the NAND die, and send a second command to the NAND die, wherein the first command and the second command define a first command sequence. In an embodiment, the first command sequence and the first address information signal a beginning of a first asynchronous read request from a first plurality of planes. Additionally, the logic 304 may send a second command sequence and second address information to the NAND die, wherein the second command sequence signals an end of the first asynchronous read request.

In one example, the logic 304 also sends the first command sequence and third address information to the NAND die, wherein the first command sequence and the third address information signal a beginning of a second asynchronous read request from a second plurality of planes. In such a case, the logic 304 may send the second command sequence and fourth address information to the NAND die, wherein the second command sequence signals an end of the second asynchronous read request.

The semiconductor apparatus 300 is therefore considered performance-enhanced at least to the extent that signaling the first and second asynchronous read requests via the first and second command sequences provides the ability to conduct more read operations in parallel. Additionally, there are no restrictions on page addresses and block addresses across all planes.

In one example, the logic 304 includes transistor channel regions that are positioned (e.g., embedded) within the substrate 302. Thus, the interface between the logic 304 and the substrate 302 may not be an abrupt junction. The logic 304 may also be considered to include an epitaxial layer that is grown on an initial wafer of the substrate 302.

Additional Notes and Examples

Example 1 includes a performance-enhanced memory device comprising a NAND die and a controller including logic coupled to one or more substrates, the logic to send a first command to the NAND die, send first address information to the NAND die, and send a second command to the NAND die, wherein the first command and the second command define a first command sequence, and wherein the first command sequence and the first address information signal a beginning of a first asynchronous read request from a first plurality of planes.

Example 2 includes the memory device of Example 1, wherein the logic is further to send a second command sequence and second address information to the NAND die, wherein the second command sequence signals an end of the first asynchronous read request.

Example 3 includes the memory device of Example 2, wherein the first address information is to identify a first plane in the first plurality of planes and the second address information is to identify a second plane in the first plurality of planes.

Example 4 includes the memory device of Example 2, wherein the logic is further to send the first command sequence and third address information to the NAND die, wherein the first command sequence and the third address information signal a beginning of a second asynchronous read request from a second plurality of planes, and send the second command sequence and fourth address information to the NAND die, wherein the second command sequence signals an end of the second asynchronous read request.

Example 5 includes the memory device of Example 4, wherein memory cells in the first plurality of planes are to be coded with a different number of bits than memory cells in the second plurality of planes.

Example 6 includes the memory device of any one of Examples 2 to 5, wherein the second command sequence is to include the first command and a third command.

Example 7 includes a semiconductor apparatus comprising one or more substrates, and logic coupled to the one or more substrates, wherein the logic is implemented at least partly in one or more of configurable or fixed-functionality hardware logic, the logic coupled to the one or more substrates to send a first command to a NAND die, send first address information to the NAND die, and send a second command to the NAND die, wherein the first command and the second command define a first command sequence, and wherein the first command sequence and the first address information signal a beginning of a first asynchronous read request from a first plurality of planes.

Example 8 includes the semiconductor apparatus of Example 7, wherein the logic coupled to the one or more substrates is further to send a second command sequence and second address information to the NAND die, wherein the second command sequence signals an end of the first asynchronous read request.

Example 9 includes the semiconductor apparatus of Example 8, wherein the first address information is to identify a first plane in the first plurality of planes and the second address information is to identify a second plane in the first plurality of planes.

Example 10 includes the semiconductor apparatus of Example 8, wherein the logic coupled to the one or more substrates is further to send the first command sequence and third address information to the NAND die, wherein the first command sequence and the third address information signal a beginning of a second asynchronous read request from a second plurality of planes, and send the second command sequence and fourth address information to the NAND die, wherein the second command sequence signals an end of the second asynchronous read request.

Example 11 includes the semiconductor apparatus of Example 10, wherein memory cells in the first plurality of planes are to be coded with a different number of bits than memory cells in the second plurality of planes.

Example 12 includes the semiconductor apparatus of any one of Examples 8 to 11, wherein the second command sequence is to include the first command and a third command.

Example 13 includes at least one computer readable storage medium comprising a set of instructions, which when executed by a computing system, cause the computing system to send a first command to a NAND die, send first address information to the NAND die, and send a second command to the NAND die, wherein the first command and the second command define a first command sequence, and wherein the first command sequence and the first address information signal a beginning of a first asynchronous read request from a first plurality of planes.

Example 14 includes the at least one computer readable storage medium of Example 13, wherein the instructions, when executed, further cause the computing system to send a second command sequence and second address information to the NAND die, wherein the second command sequence signals an end of the first asynchronous read request.

Example 15 includes the at least one computer readable storage medium of Example 14, wherein the first address information is to identify a first plane in the first plurality of planes and the second address information is to identify a second plane in the first plurality of planes.

Example 16 includes the at least one computer readable storage medium of Example 14, wherein the instructions, when executed, further cause the computing system to send the first command sequence and third address information to the NAND die, wherein the first command sequence and the third address information signal a beginning of a second asynchronous read request from a second plurality of planes, and send the second command sequence and fourth address information to the NAND die, wherein the second command sequence signals an end of the second asynchronous read request.

Example 17 includes the at least one computer readable storage medium of Example 16, wherein memory cells in the first plurality of planes are to be coded with a different number of bits than memory cells in the second plurality of planes.

Example 18 includes the at least one computer readable storage medium of any one of Examples 14 to 17, wherein the second command sequence is to include the first command and a third command.

Example 19 includes a method of operating a performance-enhanced memory device, the method comprising sending a first command to a NAND die, sending first address information to the NAND die, and sending a second command to the NAND die, wherein the first command and the second command define a first command sequence, and wherein the first command sequence and the first address information signal a beginning of a first asynchronous read request from a first plurality of planes.

Example 20 includes the method of Example 19, further including sending a second command sequence and second address information to the NAND die, wherein the second command sequence signals an end of the first asynchronous read request.

Example 21 includes means for performing the method of any one of Examples 19 to 20.

Technology described herein therefore provides the capability to queue all the planes in the die to perform fastest read simultaneously, with no page address restrictions. To minimize die size impact, eIMPRO maintains the plane group architecture (each plane group=2 planes—similar to IMPRO lite). With this, the host/controller can asynchronously queue multi-page reads across plane groups, with reads being synchronous within the plane group. The controller can read out data from one plane group when ready, while the other plane group is performing the read operations. Furthermore, the controller may enable OTF SLC reads in one plane group with QLC (or TLC) reads in the other plane group. Accordingly, the technology described herein provides the ability to queue up relatively fast read operations across all planes, which improves random read performance by, for example, 30% over IMPRO Lite.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory device comprising:
   a NAND die; and
   a controller including logic coupled to one or more substrates, the logic to:
   send a first command to the NAND die,
   send first address information to the NAND die,
   send a second command to the NAND die, wherein the first command and the second command define a first command sequence, and wherein the first command sequence and the first address information signal a beginning of a first asynchronous read request from a first plurality of planes, and
   send the first command sequence and third address information to the NAND die, wherein the first command sequence and the third address information signal a beginning of a second asynchronous read request from a second plurality of planes, and wherein the first and second asynchronous read requests are performed concurrently on multiple plane groups, wherein each plane group comprises multiple planes.

2. The memory device of claim 1, wherein the logic is further to send a second command sequence and second address information to the NAND die, wherein the second command sequence signals an end of the first asynchronous read request.

3. The memory device of claim 2, wherein the first address information is to identify a first plane in the first plurality of planes and the second address information is to identify a second plane in the first plurality of planes.

4. The memory device of claim 2, wherein the logic is further to:
   send the second command sequence and fourth address information to the NAND die, wherein the second command sequence signals an end of the second asynchronous read request.

5. The memory device of claim 4, wherein memory cells in the first plurality of planes are to be coded with a different number of bits than memory cells in the second plurality of planes.

6. The memory device of claim 2, wherein the second command sequence is to include the first command and a third command.

7. A semiconductor apparatus comprising:
   one or more substrates; and
   logic coupled to the one or more substrates, wherein the logic is implemented at least partly in one or more of configurable or fixed-functionality hardware logic, the logic coupled to the one or more substrates to:
   send a first command to a NAND die;
   send first address information to the NAND die;
   send a second command to the NAND die, wherein the first command and the second command define a first command sequence, and wherein the first command sequence and the first address information signal a beginning of a first asynchronous read request from a first plurality of planes; and send the first command sequence and third address information to the NAND die, wherein the first command sequence and the third address information signal a beginning of a second asynchronous read request from a second plurality of planes, and wherein the first and second asynchronous read requests are performed concurrently on multiple plane groups, wherein each plane group comprises multiple planes.

8. The semiconductor apparatus of claim 7, wherein the logic coupled to the one or more substrates is further to send a second command sequence and second address information to the NAND die, wherein the second command sequence signals an end of the first asynchronous read request.

9. The semiconductor apparatus of claim 8, wherein the first address information is to identify a first plane in the first plurality of planes and the second address information is to identify a second plane in the first plurality of planes.

10. The semiconductor apparatus of claim 8, wherein the logic coupled to the one or more substrates is further to:

send the second command sequence and fourth address information to the NAND die, wherein the second command sequence signals an end of the second asynchronous read request.

11. The semiconductor apparatus of claim 10, wherein memory cells in the first plurality of planes are to be coded with a different number of bits than memory cells in the second plurality of planes.

12. The semiconductor apparatus of claim 8, wherein the second command sequence is to include the first command and a third command.

13. At least one computer readable storage medium comprising a set of instructions, which when executed by a computing system, cause the computing system to:

send a first command to a NAND die;

send first address information to the NAND die;

send a second command to the NAND die, wherein the first command and the second command define a first command sequence, and wherein the first command sequence and the first address information signal a beginning of a first asynchronous read request from a first plurality of planes; and send the first command sequence and third address information to the NAND die, wherein the first command sequence and the third address information signal a beginning of a second asynchronous read request from a second plurality of planes, and wherein the first and second asynchronous read requests are performed concurrently on multiple plane groups, wherein each plane group comprises multiple planes.

14. The at least one computer readable storage medium of claim 13, wherein the instructions, when executed, further cause the computing system to send a second command sequence and second address information to the NAND die, wherein the second command sequence signals an end of the first asynchronous read request.

15. The at least one computer readable storage medium of claim 14, wherein the first address information is to identify a first plane in the first plurality of planes and the second address information is to identify a second plane in the first plurality of planes.

16. The at least one computer readable storage medium of claim 14, wherein the instructions, when executed, further cause the computing system to:

send the second command sequence and fourth address information to the NAND die, wherein the second command sequence signals an end of the second asynchronous read request.

17. The at least one computer readable storage medium of claim 16, wherein memory cells in the first plurality of planes are to be coded with a different number of bits than memory cells in the second plurality of planes.

18. The at least one computer readable storage medium of claim 14, wherein the second command sequence is to include the first command and a third command.

19. A method comprising:

sending a first command to a NAND die;

sending first address information to the NAND die;

sending a second command to the NAND die, wherein the first command and the second command define a first command sequence, and wherein the first command sequence and the first address information signal a beginning of a first asynchronous read request from a first plurality of planes; and sending the first command sequence and third address information to the NAND die, wherein the first command sequence and the third address information signal a beginning of a second asynchronous read request from a second plurality of planes, and wherein the first and second asynchronous read requests are performed concurrently on multiple plane groups, wherein each plane group comprises multiple planes.

20. The method of claim 19, further including sending a second command sequence and second address information to the NAND die, wherein the second command sequence signals an end of the first asynchronous read request.

* * * * *